US008878422B2

(12) United States Patent
Mattausch et al.

(10) Patent No.: US 8,878,422 B2
(45) Date of Patent: Nov. 4, 2014

(54) DEVICE FOR PRODUCING AN ELECTRON BEAM

(75) Inventors: Goesta Mattausch, Ullersdorf (DE); Peter Feinaeugle, Heiligenberg (DE); Volker Kirchhoff, Wehlen (DE); Dieter Weiske, Dresden (DE); Henrik Flaske, Dresden (DE); Rainer Zeibe, Radeburg (DE)

(73) Assignee: Fraunhofer-Gesellschaft zur Foerderung der Angewandten Forschung e.V., Munich (DE)

( * ) Notice: Subject to any disclaimer, the term of this patent is extended or adjusted under 35 U.S.C. 154(b) by 0 days.

(21) Appl. No.: 13/821,887

(22) PCT Filed: Sep. 8, 2011

(86) PCT No.: PCT/EP2011/004517
§ 371 (c)(1),
(2), (4) Date: Mar. 8, 2013

(87) PCT Pub. No.: WO2012/055458
PCT Pub. Date: May 3, 2012

(65) Prior Publication Data
US 2013/0162134 A1    Jun. 27, 2013

(30) Foreign Application Priority Data

Oct. 25, 2010   (DE) .......................... 10 2010 049 521

(51) Int. Cl.
| H01J 1/02 | (2006.01) |
| F03H 1/00 | (2006.01) |
| H01J 27/26 | (2006.01) |
| H01J 37/075 | (2006.01) |

(52) U.S. Cl.
CPC .................................. H01J 37/075 (2013.01)
USPC .............. 313/33; 313/11; 313/34; 313/359.1; 313/362.1; 313/360.1

(58) Field of Classification Search
None
See application file for complete search history.

(56) References Cited

U.S. PATENT DOCUMENTS

| 3,312,856 A | 4/1967 | Lafferty et al. |
| 3,430,091 A | 2/1969 | Davis |

(Continued)

FOREIGN PATENT DOCUMENTS

| DE | 25 23 360 | 12/1975 |
| DE | 27 41 363 | 3/1979 |

(Continued)

OTHER PUBLICATIONS

Machine English translation of DE 27 41 363 (Mueller et al).*

(Continued)

*Primary Examiner* — Natalie Walford
(74) *Attorney, Agent, or Firm* — Greenblum & Bernstein, P.L.C.

(57) ABSTRACT

Device for producing an electron beam includes a housing, which delimits a space that is evacuatable and has an electron beam outlet opening; an inlet structured and arranged for feeding process gas into the space; and a planar cathode and an anode, which are arranged in the space, and between which, a glow discharge plasma is producible by an applied electrical voltage. Ions are accelerateable from the glow discharge plasma onto a surface of the cathode and electrons emitted by the cathode are accelerateable into the glow discharge plasma. The cathode includes a first part made of a first material at least on an emission side, which forms a centrally arranged first surface region of the cathode, and a second part made of a second material, which forms a second surface region of the cathode that encloses the first surface region.

19 Claims, 5 Drawing Sheets

(56) References Cited

U.S. PATENT DOCUMENTS

| | | | |
|---|---|---|---|
| 4,004,172 | A | 1/1977 | Schoenmakers |
| 2007/0222358 | A1 | 9/2007 | Shonka et al. |

FOREIGN PATENT DOCUMENTS

| | | |
|---|---|---|
| GB | 1 041 282 | 9/1966 |
| SU | 813 536 | 3/1981 |

OTHER PUBLICATIONS

Rocca et al., "Glow-discharge-created electron beams: Cathode materials, electron gun designs, and technological applications." J. Appl. Phys, 56 (3), Aug. 1, 1984, pp. 790-797.

Lukas-bot et al., "Austrittsarbeit," Wikipedia, Jul. 25, 2013, XP002665086, retrieved on Dec. 5, 2011.

International Preliminary Report on Patentability and Written Opinion in counterpart international Application No. PCT/EP2011/004517, dated May 21, 2013.

German Office Action in priority application No. DE102010049521.2, dated Jun. 15, 2011.

Herbert B. Michaelson, "The work function of the elements and its periodicity," J. Appl. Phys., Vo. 48; No. 11; Nov. 1977; pp. 4729-4733.

Work function—Wikipedia, last modified on Aug. 28, 2013 at 10:41am; http://en.wikipedia.org/wiki/work_function.

G. Mattausch et al., "Cold Cathode Electron Beam Sources for High-Rate PVD," 2010 Society of Vacuum Coaters, 505/856-7188; $53^{rd}$ Annual Technical Conference Proceedings, Orlando, FL; Apr. 17-22, 2010; pp. 273-279.

Work function—Wikipedia, last modified Feb. 19, 2014 at 21:07; http://en.wikipedia.org/wiki/work_function.

* cited by examiner

DEVICE FOR PRODUCING AN ELECTRON BEAM

CROSS REFERENCE TO RELATED APPLICATIONS

The present application is a National Stage Application of International Application No. PCT/EP2011/004517 filed Sep. 8, 2011, which published as WO 2012/055458 A1 on May 3, 2012, the disclosure of which is expressly incorporated by reference herein in its entirety. Further, the present application claims priority under 35 U.S.C. §119 and §365 of German Application No. 10 2010 049 521.2 filed Oct. 25, 2010.

BACKGROUND OF THE INVENTION

1. Field of the Invention

The invention relates to a device for producing an electron beam. In particular, a "slimmer" electron beam with a small focal diameter and a high power density may be produced with a device according to the invention and may act at a defined process location inside a vacuum chamber, wherein the beam generator and power supply assemblies thereof are characterized by a compact structure, ease of maintenance and relatively low manufacturing costs. Typical technological application fields for an electron beam generator according to the invention are the coating of substrates with functional layers (such as, e.g., layers for corrosion protection, decoration, diffusion barriers, EMC shielding, thermal insulation, etc.) using physical vapor deposition (PVD), the cleaning and remelt processing of metals in a vacuum as well as the adhesive joining of components by fusion welding.

2. Discussion of Background Information

The processing of semi-finished products and products using decorative or functional thin-film systems is an important work field in surface engineering. In this case, the versatile, environmental-friendly and economical methods of physical vapor deposition (PVD) have found wide-spread use in production processes, in which the coating material is first vaporized in a vacuum and then condensed as a film on the respective substrates in a controlled manner, sometimes also with the addition of reactive gases. In addition to the achievable morphology, purity and adhesion of the layer being deposited, important criteria for the selection of a suitable coating method from the different technologies available are above all also its build-up speed as well as investment needs and operating costs for the vaporizer, because the economy of the process depends significantly on these characteristics.

Electron beam sources of different designs have been used for many decades for implementing industrial high-rate PVD methods. Electron beam vaporizers supply the greatest commercially established coating rates with simultaneously excellent uniformity and purity of the deposited layer, and this also in the case of reactive, ferromagnetic and high-melting coating materials. These characteristics result from the high power flux density that can be adjusted inertia-free by magnetic focusing and beam guidance as well as the direct heating of the vapor-emitting surface. As a result, the crucibles required for storing the coating material may be cooled, and thus, do not cause any contamination of the coating.

Cathodes heated exclusively to a high operating temperature are currently established as electron sources for industrial PVD processes, in which the production of free electrons is based on the thermoelectric effect (GB 1 041 282 A). The functional principle of these electrodes, also called "thermionic cathodes," causes the traditional electron emitters to be more structurally complicated and be designed in a relatively involved manner with respect to their power supply devices and that certain embodiments are only able to cover a very limited range of technological applications.

For example, so-called transverse electron beam sources (also called "transverse EB guns"), in which the beam generation, magnetic 270° beam deflection and a crucible with vaporizer material are integrated most of the time in a compact functional block, are a common vapor source for the electron beam vaporization (also called "EB PVD"). These sources are relatively inexpensive, but are limited in terms of their maximum beam power (approximately 20 kW) as well as acceleration voltage (approximately 20 kV), and are therefore, also limited with respect to the vaporization rate that can be produced. In addition, the actual beam source (cathode with heating device) is located at the pressure level of the coating chamber and is directly exposed to the vapors and gases located therein.

Consequently, the pressure in the coating chamber must be kept at low values by correspondingly generous dimensioning of the vacuum pumps in order to prevent instabilities when operating the electron source. In the case of high-rate deposition of dielectric compounds, which, to ensure a stoichiometry that meets requirements, requires a reactive process management, i.e., the setting of a relatively high partial pressure (approximately 0.1 Pa to 1.0 Pa) of reactive gases inside the vacuum chamber, "transverse EB guns" have not been able to gain acceptance despite numerous structural or circuit-related improvements, especially due to their unacceptably high tendency toward high-voltage spark-overs under these process conditions.

So-called axial electron beam sources ("axial EB guns") that are designed for vaporization methods with beam powers up to 300 kW and acceleration voltages up to 60 kV (for special applications also up to 75 kV) are a technologically more powerful beam tool for EB PVD. The cathode chamber of these types of beam generators is separated from the process chamber by panels with a small mostly circular opening for the passage of the beam, which function in terms of the vacuum as flow resistances, and is evacuated separately with additional high-vacuum pumps (in contemporary embodiments by turbomolecular pumps). Therefore, the vaporization process is also still able to run at higher pressures and especially also with a high proportion of reactive gases in the coating chamber. Furthermore, higher coating rates are achieved hereby without losses in stability. However, these types of systems are quite expensive with respect to the required investment costs and for economic reasons are therefore also able to be used advantageously only in a narrow field of application.

In order to overcome this limitation, several cold-cathode beam generators with a plasma anode were proposed in which the electron release is not based on the thermoelectric effect, but results from the ion bombardment of a large-scale metal electrode. A high-voltage glow discharge maintained in the beam source hereby produces ions and accelerates said ions to the cathode. The electrons transferred there ballistically from the solid body into the vacuum are accelerated in the cathode fall of the plasma and formed by suitable electrode contours into a homocentric beam, which is able to be focused with conventional electron-optical assemblies and guided to a vaporizer.

While thermoelectric emitters require a high vacuum of greater than $10^{-3}$ Pa in the cathode chamber, the operating pressure with a plasma-stimulated cold cathode is in the range of 2 to 10 Pa depending upon the operating voltage, plasma process gas, and the discharge current that is currently in demand. Therefore, it is possible to dispense with a differential evacuation of the beam source up to a pressure of approximately 1 Pa in the coating chamber without sacrificing the essential advantages of the axial emitter such as technological universality, as well as spatial and vacuum-related separation of the vaporizer and the beam source, and the associated gain in reliability. The regulation of the beam power takes place in this case by varying the plasma density in the cathode chamber by a rapid gas flow regulation. Instead of the previously common multi-conductor high-voltage feed in the case of thermionic cathodes, a single-pole cable suffices, and the high-voltage power supply also does not require any additional power supply unit floating at a high potential. It must be emphasized as the economically significant result that systems realized on the basis of cold-cathode emitters, which are made up of a beam source including power supply and control components thereof, are able to be manufactured at considerably lower costs as compared to conventional axial emitter systems.

The described cold-cathode axial emitters thus have many advantages as compared to conventional thermionic cathode emitters, but they also have some inadequacies in the case of certain technical parameters or for special applications. Thus, it requires the relatively low achievable emission current density of the cold cathode (100 mA/cm$^2$ as compared up to 10 A/cm$^2$ for a tungsten thermionic cathode) to implement large-scale cathodes for high currents. This results in a tendency for a larger beam diameter and a lower power density at the process location. The physical size of the beam source therefore increases again in an undesirable manner in the high-performance range. In addition, the electron optics are more expensive, while in general the vaporization rate is somewhat lower than with conventional systems with the same nominal power.

The process gas required to maintain the high-voltage glow discharge in the cathode chamber flows permanently through the axial opening required for outcoupling the beam into the process chamber, because, to regulate the discharge in the emitter itself, a slight excess pressure must always be maintained as compared to the process chamber. This gas load must be pumped off by the vacuum system of the process chamber in addition to the technologically induced incidence of gas.

Moreover, in order to ensure an acceptable degree of efficiency (relationship between the beam power that can be outcoupled and the total power supplied to the discharge, target value: >90%), reactive components such as, for example, oxygen or carbon dioxide, are required in the plasma process gas. Said reactive components serve to form and stabilize dielectric coats on the cathode surface and therefore to increase the secondary electron yield thereof (emitted electrons per incident ion). Viewed technologically, however, this approach is problematic for processes with high inertization or purity requirements, and, in terms of the system, it entails an additional effort when handling the significantly increased rate of high-voltage spark-overs as compared to metallically blank electrode surfaces.

The competing requirements for field strength relief for the cathode (great electrode distances are sought for this) and reliable dark-field shielding (small electrode distances are advantageous for this) make it more and more difficult to maintain high acceleration voltages in a stable manner in the long term in the case of plasma-based beam sources with increasing operating pressure. So far, operating voltages around 30 kV that have been dominated in the high-performance range with cold cathode emitters are sufficient for high-vacuum coating methods such as, e.g., metallizing (with approximately 0.001 to 0.01 Pa). For reactive high-rate coating processes with a typically distinctly higher pressure in the process chamber (approximately 0.1 to 1 Pa), however, voltages in the range of 40 to 60 kV would be more expedient due to the therewith better energy transport ability of the beam.

The power loss at the cathode resulting from the ion bombardment is relatively high in terms of order of magnitude at approximately 5% of the outcoupled beam power. A direct water cooling of the cathode is therefore indispensable with high beam powers. However, this is disadvantageous for two reasons. For one thing, the cooling water comes into contact with the electrode conducting the high voltage. Therefore, to reduce this potential difference with a low level of leakage current, as well as to ensure adequate personnel protection, several meters (reference value: >1 m/5 kV, respectively for forward and return path) of specially safety-insulated hoses must be laid. For another thing, the water circuit must be blocked, blown out, and opened in a labor-intensive manner for each cathode exchange.

SUMMARY OF EMBODIMENTS OF THE INVENTION

Therefore, the invention is based on the technical problem of creating a device for producing an electron beam by which the disadvantages of the prior art are able to be overcome. In particular, a slim electron beam with a small focal diameter and high power density with simultaneously simple structural form and system configuration is supposed to be able to be produced with the device.

The solution to the technical problem is yielded by subjects having the features of the independent claims. Other advantageous embodiments of the invention are yielded from the dependent patent claims.

A device according to the invention comprises a housing, which delimits a space that can be evacuated at least in one region. A process gas is admitted to the space that can be evacuated though an inlet in the housing so that a glow discharge plasma may be formed between a planar cathode and an associated anode, both of which are arranged in the space that can be evacuated (also called cathode chamber in the following). For this purpose, an electrical voltage is connected between the cathode and the anode by a power supply device. All high-voltage equipment known from the prior art that is able to provide the voltages (typically <$10^3$ kV) and currents (typically <25 A) required with respect to technology may be used as a power supply device. Ions from the glow discharge plasma are accelerated in the direction of the cathode and, when striking the cathode surface, liberate secondary electrons, which are accelerated in the cathode fall and are formed into an electron beam, which is guided out of the housing through an electron beam outlet opening and then further to a process location. In this respect, a device according to the invention is similar to an electron beam generator with a cold cathode, in which the electron beam is produced on the basis of a glow discharge.

An essential feature of a device according to the invention is constituted in the special embodiment of the planar cathode. Said cathode comprises at least two parts, which are made of electrically conductive, but otherwise different materials. In a central first surface region, the cathode of a device according to the invention is made of at least one first material, which has both a comparatively high secondary electron yield ($\gamma$>5; the precise value depends upon the energy of the projectile ions) (such as is required in the case of a beam source with a cold cathode and an associated plasma anode), as well as a low electron work function ($\phi$<4 eV) and a high melting point (Ts>1750 K) (such as is advantageous in the case of a thermionic cathode). Available materials that satisfy these criteria are found, for example, in the group of rare earth borides. In the case of one embodiment, the first part of the cathode, which forms the central surface region, is made of a solid, disk-shaped lanthanum hexaboride ($LaB_6$) tablet. In the case of another embodiment, the first part of the cathode is made of a composite body, which comprises a $LaB_6$ layer in the surface region emitting electrons, said layer being affixed to a temperature-resistant substrate plate by a high-temperature adhesive or solder. Alternatively, the layer made of $LaB_6$ may also be deposited on the substrate plate by other methods such as for example PVD methods, sintering, welding or a powder spray process.

A second part of the cathode with a surface region, which encloses the central, first surface region, is made of a second material. The second material has a high temperature resistance (Ts>1750 K) and a thermal conductivity that is as low as possible and has only a low secondary electron yield ($\gamma<5$) with high work function ($\phi>4$ eV). Graphite is especially suited for this for example. Alternatively, however, materials like refractory metals, such as, for example, W, Ta, Mo, Ti, alloys of these materials, or even stainless steel (for low beam powers) may be used for this.

Known electron beam generators with a cold cathode normally have a cooling device by which the cathode itself is cooled, on the one hand, so that its material (for example, aluminum) does not melt due to the energy input from the ion bombardment, and, on the other hand, such a cooling device also cools the components adjacent to the cold cathode so that they do not get damaged.

A device according to the invention may likewise have a cooling device. However, said cooling device does not cool the cathode, because, according to the invention, at least the heating of the first part having the center surface region of the cathode from the ion bombardment is desired or even required, as will be explained in the following. It is advantageous to insulate the cathode thermally from adjacent components, because, in the case of a device according to the invention, only components adjacent to the cathode are supposed to be cooled by a cooling device. This relates in particular to components which in terms of the electron beam are arranged behind the cathode.

If, in the case of a device according to the invention, a glow discharge is ignited in which a usual electrical high voltage for an electron beam generator is applied between the cathode and anode and a process gas is guided through the inlet into the evacuated cathode chamber, the following occurs: The first center region of the cathode, which is cold to begin with and is made of the first material, functions first only as a secondary electron emitter by the impingement with accelerated ions. Under the continuous ion bombardment and in the absence of cooling, this region heats up steadily however until the first material ultimately reaches a surface temperature at which, in addition, thermionically emitted electrons also exit due to the thermoelectric effect and increase the electron current density of the electron beam. Starting at this surface temperature, both emission mechanisms act in coexistence, wherein the thermoelectric effect attains an increasing dominance with a further increasing surface temperature of the first material. Therefore, electron current densities can be achieved with a device according to the invention such as those that are otherwise known only from electron beam generators with a thermionic cathode. Because both emission mechanisms act in the case of the cathode of a device according to the invention, the term "hybrid cathode" is introduced at this point for this type of cathode.

In the case of both emission modes, the free electrons originate with a hybrid cathode, however, predominantly from the first part of the cathode, which is made of the first material. Therefore, this part of the cathode will also be called "emitter" in the following. The low number of secondary electrons, which are emitted by the second material, is negligible, however, for the power density profile of the electron beam. Because the electrons of the electron beam essentially come only from the emitter, the shape and size thereof are also decisive for the shape and dimensions of the electron beam cross section. As already explained, the surface of the emitter only accounts for a portion of the cathode surface, which is why electron beam generators with a hybrid cathode can produce electron beams with a small beam cross section. This is in comparison to electron beam generators with a cold cathode, in which electrons are emitted from the entire surface of an associated planar cathode and therefore electron beams having a large cross section are generated.

Generally, the surfaces emitting electrons in the case of cold cathode axial emitters have a round, concave, curved shape in order to form an electron beam with a round cross section. A hybrid cathode is likewise preferably designed to be round. In this case, the material of the emitter is designed as a round disk and the second material, which encloses the emitter, is designed to be annular with a concave curvature. Alternatively, the emitter may also have any other geometric shape, however.

The surface of the emitter that emits electrons may be designed to be planar, convex or concave. Furthermore, the surface of the emitter may be arranged flush with the surrounding surface of the second material or be opposed to the surface thereof by a defined distance, or be arranged axially offset in the emission direction. In order to optimize the thermal insulation of the emitter, at least one evacuated gap between the rear side of the cathode and the cooled adjacent components is expedient. Better still is a radiation shield designed as a thermally floating multilayer reflector that is arranged on the rear side.

The second material, which encloses the emitter, has essentially three tasks to fulfill besides a holding function for the emitter material.

First, the surface of the cathode is enlarged by the second material. If specifically an electron beam with a small beam diameter is supposed to be produced and consequently the surface of the emitter that emits the electrons is very small, then the sole surface of the emitter may be too small to maintain a stable glow discharge between the emitter and anode. For this reason, the second material must also be electrically conductive and have the same electrical potential as the emitter in order to enlarge the cathode surface. In the case of one embodiment, therefore, the surface of the second material exposed to the ion bombardment is at least three times as large as that of the emitter.

Second, the topic of the thermal insulation of the cathode with respect to adjacent components was already explained. In this connection, the second material, which encloses the emitter material, forms a first level of thermal insulation of the emitter with respect to adjacent assemblies. Said emitter gets very hot due to the ion bombardment. The second material, which is heated both as a result of the ion bombardment as well as by thermal conduction coming from the emitter, should therefore have a poor level of thermal conductivity. The emitter may also be spaced apart by a gap from the enclosing second material in order to form a thermal barrier. This gap then simultaneously acts as an expansion joint for the emitter material that heats up and thereby expands. In doing so, the gap should be dimensioned such that it is not completely closed by the expanding emitter material even in the case of maximum heating of the emitter material. It must always be ensured, however, by a suitable contacting (e.g., by a circlip) that the emitter and the second material have the same electrical potential and that the transport of current to the emitter remains guaranteed.

Third, it is possible to influence the electrostatic beam formation by varying the geometric shape of the second material. To produce an axial electron beam, the surface of the second material is curved preferably spherically concavely or conically and thereby forms a (quasi) spherical course of the electrical equipotential surfaces in the region of the emitter axis, which then leads to the radial-convergent acceleration of the electrons. These types of homocentric electron beams are able to be guided especially easily electron-optically and project to the process location with higher power density. The surface contour of the second material is selected in particular so that the diameter of the electron beam is as small as possible in the region of the outlet opening from the housing of the cathode chamber. Under these conditions, the cross section of the outlet opening may also be kept small, which makes it possible to maintain the glow discharge in the cathode chamber with relatively low process gas consumption.

During use of an electron beam generator according to the invention, said electron beam generator is flange-mounted preferably on a wall of a vacuum process chamber so that the vacuum thereof extends through the beam outlet opening into the interior of the cathode chamber. Therefore, the electron beam generator itself does not need its own vacuum pump in order to evacuate the cathode chamber, rather this takes place by the vacuum pump(s) of the vacuum chamber as long as it is possible to select the process pressure in the vacuum chamber to be less than the operating pressure of the glow discharge in the cathode chamber.

As is the case with a cold cathode, the control variable for regulating the emission current of a hybrid cathode is the flow rate of the plasma process gas. In contrast to the cold cathode, the electron emission is controlled, however, not just directly via the ion current density and the generation of secondary electrons that depends directly thereon, but also indirectly via the regulation of the temperature of the emission surface and the release of thermionic electrons that depends thereon.

The invention makes it possible to realize an electron beam generator of the axial type, which combines the advantages of a conventional electron emitter with a thermionic cathode (high emission current density and beam power density, high acceleration voltages, no reactive gas loading of the process chamber, cooling circuits on earth potential) and those of cold cathode emitters with a plasma anode (less expensive and more compact structure, no separate vacuum system, simplified high-voltage power supply, power control on earth potential).

Because the diameter of the emitter is comparatively small, it is possible, with the same current and a comparatively simple structure, for a hybrid cathode to produce substantially slimmer electron beams (with greater power density) than with a cold aluminum large-surface cathode and act at the process location (e.g., on a vaporization crucible) more efficiently than before. Experimentally, a current of >3 A with 25 kV acceleration voltage was extracted from a hybrid cathode with a $LaB_6$ emitter with a 17 mm diameter and an associated graphite ring with a 90 mm outside diameter. For comparison, the previously used solid aluminum cold cathode with a 90 mm diameter supplies this current with a beam diameter that is approximately five times higher.

According to the analysis so far of the hybrid cathode concept based on a gas-discharge-heated $LaB_6$ emitter, it is possible to use an inert plasma process gas, such as all inert gases for example, in the cathode chamber in the case of a device according to the invention (in contrast to devices with a cold cathode). An admixture of reactive gases is possible in principle, but may produce a so-called "chemical cathode poisoning," because for example oxygen and water vapor increase the work function in the case of a $LaB_6$ emitter. Light process gases are to be favored due to the associated reduced sputter erosion of the emission surface ("physical cathode poisoning") and a low scattering of the electrons. Taking economic constraints into consideration, technically pure helium or even hydrogen, for example, offer technically adequate and simultaneously cost-effective solutions.

As already mentioned, regulating the power of the hybrid cathode takes place by varying the process gas flow into the cathode chamber. In the thermoelectric emission mode this has an effect only indirectly via the regulation of the temperature of the emission surface. Compared with shock-wave heating from the rear side of the cathode block that is common for conventional high-performance emitters, dynamic advantages are still available, because the thermal inertia of the cathode body is manifested less strongly when heating from the emission side, as it is brought about by the ion bombardment.

Experiments have shown that the combined emission mechanism of the hybrid cathode as compared to known cold cathodes is also accompanied (with the same current) by reduced process gas pressure in the cathode chamber and the power loss that is positively correlated therewith. The produces three advantages: First, the gas quantity overflowing from the cathode chamber into a process chamber is reduced with favorable effects on the operating pressure that can be achieved there or with reduced requirements for dimensioning the vacuum system. Second, a direct water cooling of the cathode becomes unnecessary (thereby eliminating complicated, high-voltage-resistant insulated cooling water hoses and the cooling circuit no longer needs to be opened when exchanging the cathode). Third, the required dark-field shielding of the cathode holder may be designed more simply, and higher acceleration voltages (e.g., in the range of 40 to 60 kV) may also be applied with less effort.

For the sake of completeness, it is mentioned at this point that different solutions may be used to arrive at the realization of an anode in the case of a device according to the invention, just as is known from the prior art. In the simplest case, the housing of the cathode chamber may be connected electrically as an anode. But it is also possible to arrange a separate anode in the cathode chamber, which anode is electrically insulated from the grounded housing, and therefore, is also able to conduct a different potential. Such a separate electrode may be designed to be annular for example, wherein the ring opening functions as the electron beam outlet opening.

Aspects of embodiments of the invention are directed to a device for producing an electron beam, comprising: a housing, which delimits a space that is evacuatable, and comprises an electron beam outlet opening; an inlet structured and arranged for feeding a process gas into the space; and a planar cathode and an anode, which are arranged in the space, and between which, a glow discharge plasma is producible by an applied electrical voltage, wherein ions are accelerateable from the glow discharge plasma onto a surface of the cathode and electrons emitted by the cathode are accelerateable into the glow discharge plasma. The cathode comprises a first part made of a first material at least on an emission side, which forms a centrally arranged first surface region of the cathode, and a second part made of a second material, which forms a second surface region of the cathode that encloses the first surface region. The first material is electrically conductive and has an electron work function less than 4 eV, and the second material is electrically conductive and has an electron work function greater than 4 eV. The first material is heatable by impingement with accelerated ions to a temperature at which electrons escape from the first material predominantly due to thermionic emission.

In embodiments of the invention, the first surface region is flat.

In additional embodiments of the invention, the first surface region is concave.

In further embodiments of the invention, the second surface region is concave.

In yet further embodiments of the invention, the first material comprises a rare earth boride.

In embodiments of the invention, the first surface region comprises a solid molded body made of the first material.

In additional embodiments of the invention, the first surface region is a constituent of a composite body.

In further embodiments of the invention, the second material comprises graphite.

In yet further embodiments of the invention, the second material comprises a metal.

In embodiments of the invention, the first surface region and the second surface region are separated from one another by a circumferential gap around the first surface region.

In additional embodiments of the invention, the device further comprises a rear-side thermal barrier of cooled parts, wherein at least the first material is thermally insulated by the rear-side thermal barrier of cooled parts.

In further embodiments of the invention, the thermal barrier comprises at least one of: at least one gap that is evacuateable; and a thermal insulator.

In yet further embodiments of the invention, the process gas of the glow discharge plasma is one of an inert gas and hydrogen.

In embodiments of the invention, a beam power of the device is controllable in the case of constant or pulsed operating voltage by varying a process gas flow of the glow discharge plasma.

In additional embodiments of the invention, the device further comprises an electrical insulator body, wherein the electrical insulator body comprises cooling channels separated from a cathode potential and a vacuum-tight high-voltage lead-through.

In further embodiments of the invention, the device further comprises a magnetic coil system in a region between the cathode and the anode, wherein a propagation direction of the electron beam in the cathode chamber is controllable by a transverse magnetic field produced by the magnetic coil system.

In yet further embodiments of the invention, the electrical insulator body comprises a synthetic material comprising one of an oxide ceramic and aluminum nitride.

In embodiments of the invention, the planar cathode comprises at least one planar surface.

BRIEF DESCRIPTION OF THE DRAWINGS

The invention will be explained in more detail in the following on the basis of exemplary embodiments. The figures show.

DETAILED DESCRIPTION OF EMBODIMENTS OF THE INVENTION

Graphic elements within a figure whose surfaces are filled with same pattern constitute one component. A device according to the invention is depicted schematically in FIG. 1. An electron beam generator 11, which comprises a housing 12, is fastened on a vacuum chamber 10.

The housing 12 delimits on the beam outlet side a space 13 that can be evacuated and that forms a cathode chamber. A round, planar cathode 14 made of two materials is arranged in the cathode chamber 13. A disk-shaped and planar emitter 14a made of $LaB_6$ with a disk having a diameter of 17 mm functions as the center region of the cathode 14. The emitter 14a is surrounded by a graphite ring 14b with an outside diameter of 90 mm, but separated mechanically therefrom by a circumferential gap. Nevertheless, both the graphite ring 14b and the emitter disk 14a have the same electrical (cathode) potential by contacting elements that are not shown in FIG. 1. Arranged opposing the cathode 14 is an anode 15, which is designed as an annular disk and whose axial ring opening functions as an electron beam outlet opening into the vacuum chamber 10. Vacuum pumps 10a of the vacuum chamber 10 evacuate both the vacuum chamber 10 itself as well as the cathode chamber 13, into which the vacuum of the vacuum chamber 10 extends through the ring opening of the anode 15.

Figure 1:
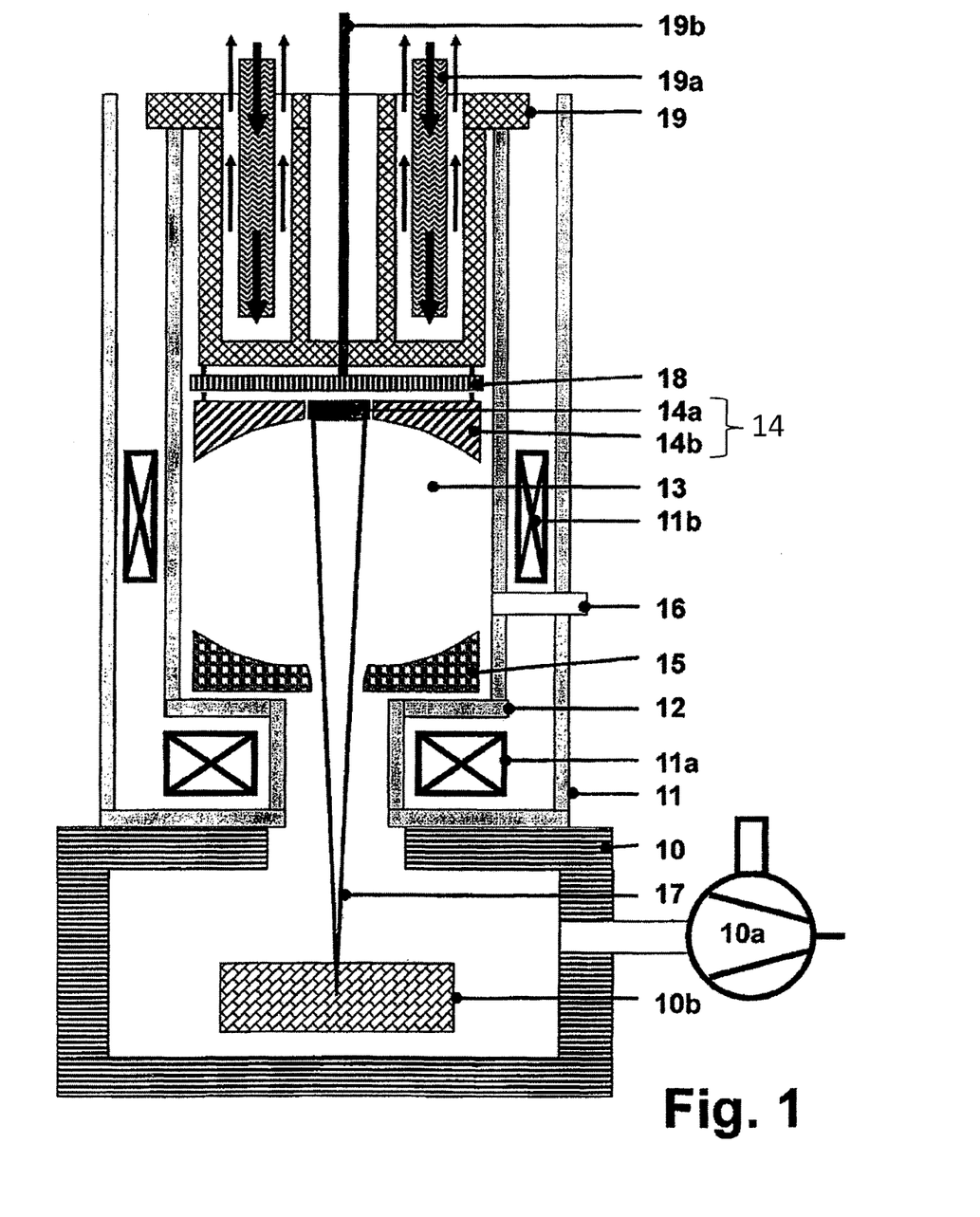
FIG. 1 A schematic representation of a device according to the invention for producing an electron beam.

To ignite a glow discharge between the cathode 14 and the anode 15, helium is admitted into the evacuated cathode chamber 13 through a gas inlet 16. At the same time an electrical high voltage of −30 kV that is typical for electron beam generators is connected, which functions as the operating voltage between the cathode 14 and anode 15. The anode 15, which is separated mechanically from the housing 12, may optionally be applied on earth potential or a different electrical potential may be applied. Depending upon the technological purpose of the electron beam generator 11, it may furthermore be expedient to apply the high voltage not as direct voltage, but in the form of voltage pulses in a rapid sequence. After that, a glow discharge plasma forms between the cathode 14 and anode 15, the ions of which are accelerated onto the surface of the cathode 14, whereupon secondary electrons are emitted principally from the material of the emitters 14a. Because of the relatively small surface of the emitter 14a emitting electrons and the concave shape of the graphite ring 14b, the emitted electrons are bundled into a slim electron beam 17.

Due to the continuous ion bombardment of the uncooled emitter surface, said surface is heated to a temperature, starting at which, in addition to the secondary electrons, electrons based on thermal emission of emitter material are also emitted, which increase the power density of the electron beam 17. In this way, an electron beam with a small beam cross section and very high power density is created. Said beam is coupled out from the cathode chamber 13 through the electron beam outlet opening of the anode 15. Said beam is then guided by known electron-optical assemblies 11a (lens assemblies and deflecting coils) of the electron beam generator 11 to a target 10b arranged in the vacuum chamber 10 and is able to act there as defined by the intended processing task (e.g., heating, melting or vaporizing material).

Arranged outside the cathode chamber 13 at approximately half the distance between the cathode 14 and anode 15 is an additional magnetic coil system 11b, which is made of two crossed pairs of saddle coils. This makes it possible to produce a magnetic field of variable field strength in the cathode chamber 13 with a field line characteristic that is perpendicular to the emitter axis, but can be freely aligned azimuthally. In contrast to known magnetic coil systems for axial discharge arrangements in which sometimes an axial magnetic field is used for plasma compression or to stabilize the discharge, the magnetic coil system 11b described here is used to produce a magnetic field that runs transverse to the electron beam axis that is able to be used to influence the propagation direction of the electron beam 17. This makes it possible to center the electron beam 17 precisely at all times on the electron beam outlet opening of the anode 15 even under the influence of external interference fields or despite slight maladjustments of the cathode 14. In contrast to known emitter systems, in which the centering unit is part of the electron-optical column beneath the anode, the magnetic coil system 11b described here already has an effect in the cathode chamber 13, i.e., already during the acceleration of the electrons, and is therefore especially effective. With this auxiliary magnetic coil system 11b, the diameter of the electron beam outlet opening is able to be especially narrow (<20% of the cathode diameter) and thereby further reduce the consumption of plasma process gas. The magnetic coil system 11b is explained here specifically on the basis of a concrete exemplary embodiment, but may also be used, however, with all other embodiments of the devices according to the invention by arranging said magnetic coil system outside the cathode chamber at a height between the hybrid cathode and the associated anode.

The high temperatures to which the emitter 14a is heated due to the ion bombardment require a thermal protection for adjacent structural elements. For this purpose, a thermal insulator 18 is arranged on the rear side of the cathode 14, which insulator is fastened, in turn, to an electrical insulator 19. The latter functions simultaneously as a wall for the cathode chamber 13 and also comprises cooling channels 19a and a vacuum-tight, high-voltage lead 19b into the cathode chamber 13. The cooling channels 19a are designed to be tubular. A cooling medium flows downwardly inside these tubes (which is illustrated by the thicker arrows pointing downward), and upwardly again (illustrated by the thinner arrows pointing upwardly) in interstices, which extend between the tubes and the electrical insulator 19. For the purpose of improved thermal insulation of the emitter 14a, said emitter 14a is spaced apart by respective gaps from both the thermal insulator 18 and from the graphite ring 14b.

Figure 2:
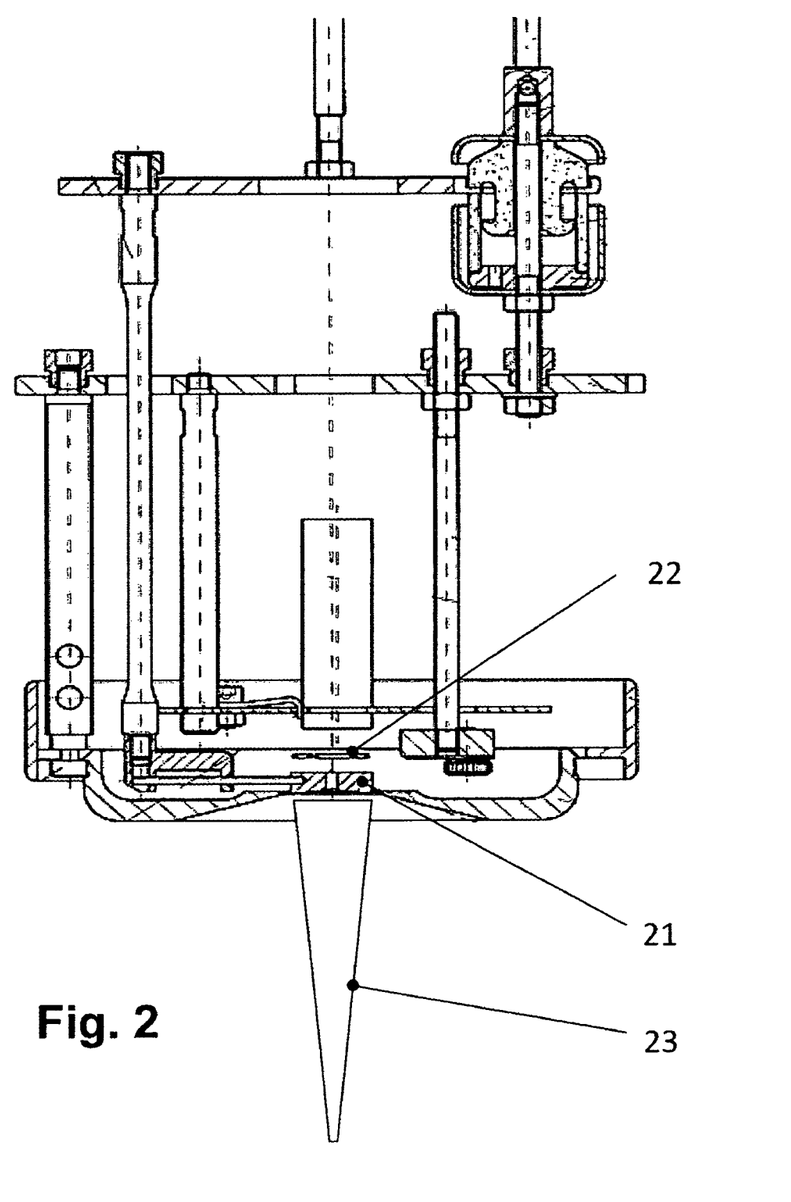
FIG. 2 A schematic representation of the cathode head of an electron beam source with a shock-wave-heated, thermionic block cathode.
Figure 3:
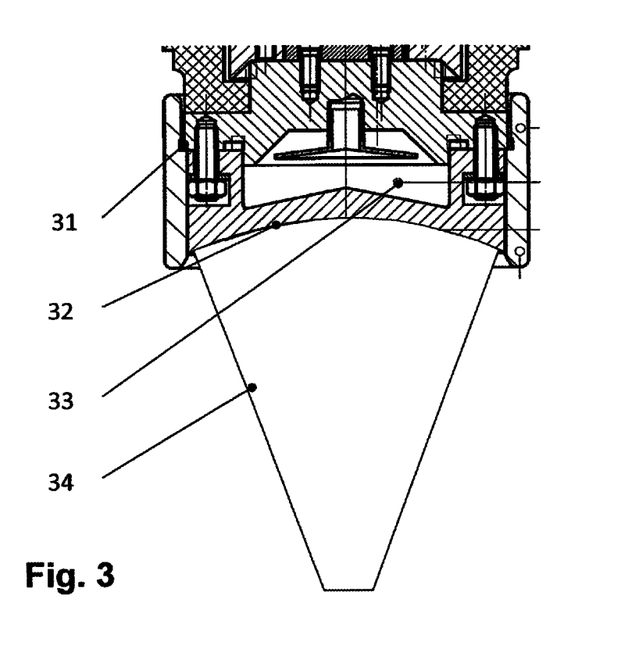
FIG. 3 A schematic representation of the of the cathode head of an electron beam source with a directly cooled, glow-discharge-stimulated cold cathode.

As a comparison with the prior art, a known cathode plug with a tungsten thermionic cathode is depicted in FIG. 2 and a likewise known cathode head with an aluminum cold cathode is shown schematically in FIG. 3.

In addition to the thermionic cathode 21 made of tungsten, the cathode plug from FIG. 2 also comprises a heating coil 22. Said heating coil is used to heat up the cathode 21 from the rear side by electron impact so that electrons are emitted due to the thermoelectric effect when a corresponding temperature is reached on the front side of the cathode 21. Because of the relatively small cross section of the cathode 21, an electron beam 23 with a small beam cross section is generated with this type of a device. However, three electrical potentials must be fed to such a cathode plug, two electrical potentials for the coiled filament and the electrical potential for the cathode (i.e., the cathode potential). The high operating temperature of the tungsten thermionic cathode as well as the need for guidance and mutual electrical insulation of several potentials in a limited space require a comparatively complicated mechanical structure for the cathode plug, resulting in expensive manufacturing along with high requirements for assembly and adjustment.

The cathode head from FIG. 3 comprises an assembly base 31, on which a disk-shaped cold cathode 32 made of aluminum with an outside diameter of 90 mm is fixed by screwed connections, wherein these two elements enclose a hollow space 33, through which a cooling medium flows. Therefore, the cooling medium flows directly past the rear side of the cathode 32 and cools it. A glow plasma can be produced between the cathode 32 and an anode (not shown in FIG. 3). Ions are accelerated from said glow plasma onto the surface of the cathode 32, whereby secondary electrons exit from the cathode material. Because these secondary electrons are emitted from the entire surface of the cathode 32 and do not cause any other emission mechanisms that could release additional electrons, an electron beam 44 is generated with a relatively large beam cross section and low power density in relation to the electron beams 17 and 23 from FIG. 1 and FIG. 2. In comparison to the expensive cathode head for the tungsten thermionic cathode from FIG. 2, the cathode head of the cold cathode of FIG. 3, however, has a structurally simpler design and is easier to maintain.

Figure 4:
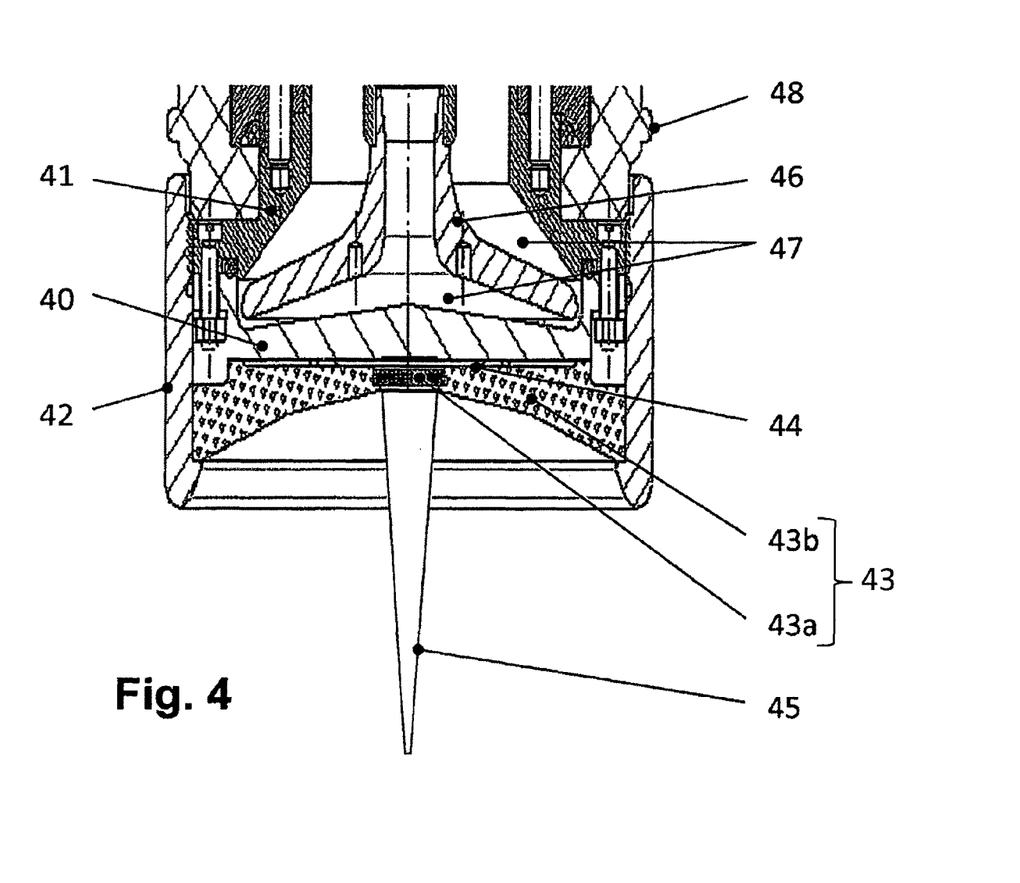
FIG. 4 A schematic representation of the cathode head of a device according to the invention in an embodiment with a directly cooled assembly base.

FIG. 4 schematically depicts the cathode head of a device according to the invention in a first design variation in a somewhat more detailed manner. The cathode head comprises an assembly base (i.e., first assembly base) 40 made of aluminum and an assembly base (i.e., second assembly base) 41 made of stainless steel, which are pressed against each other by screwed connections. A union nut 42 is used to press a graphite ring 43b with an outside diameter of 90 mm on the assembly base 40. In doing so, the graphite ring 43b, in whose ring opening, a flat $LaB_6$ emitter disk 43a with a 17 mm outside diameter is inserted, is formed such that the graphite ring 43b is spaced apart on a large scale from the assembly base 40 by a gap 44 for the purpose of thermal insulation. The emitter 43a and the graphite ring 43b together form a hybrid cathode 43, in which electrons for an electron beam 45 are emitted primarily by the emitter 43a. Arranged on the other side of the assembly base 40 is a molded body 46, which therewith forms hollow spaces 47 towards the assembly bases 40 and 41. A cooling medium flows through these hollow spaces 47, wherein the molded body 46 ensures a directed inflow and intensive cooling of the assembly base 40. The cathode head also comprises an insulator body 48 made of synthetic material, which electrically insulates components arranged behind the cathode head from the cathode potential. This first design variation of the device according to the invention makes it possible to already produce an electron beam 45 having a comparatively simple structural design and usage of cost-effective materials for constructing the cathode head, and which corresponds in teens of its diameter and its power density to that of the tungsten thermionic cathode from FIG. 2. Moreover, it is advantageous that the cooling circuit no longer needs to be opened when exchanging the hybrid cathode 43, as is required in the case of the cold cathode according to FIG. 3. However, it is also disadvantageous in the case of the design variation of the invention that has already been described that there is still a direct electrical contact of the cooling medium with the cathode potential, which results in an increased expense for the safety insulation of the cooling circuit for the cathode head.

Figure 5:
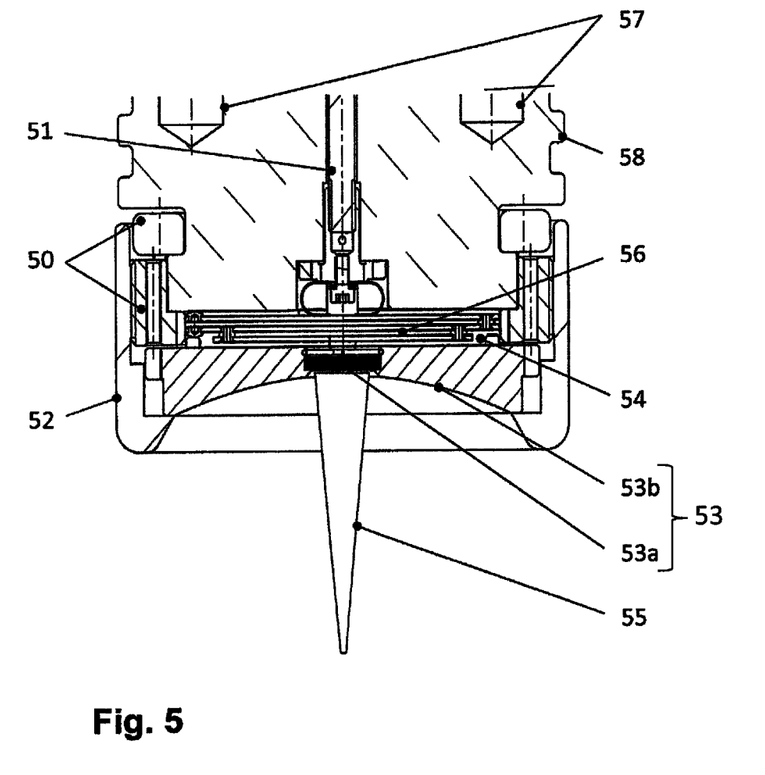
FIG. 5 A schematic representation of the cathode head of a device according to the invention in an embodiment with an indirectly cooled assembly base and a thermally floating radiation shield.

The cathode head of a device according to the invention is shown schematically in FIG. 5 in a second, further improved design variation. The cathode head in turn comprises an assembly base 50 formed of two parts, made of molybdenum in this case, which are pressed against each other by screwed connections, and are made of an electrical insulator body 58, in this case of aluminum nitride. Alternatively, the insulator body 58 could also be made of an oxide ceramic. A union nut 52 is used to press a graphite ring 53*b* (outside diameter 90 mm), in whose ring opening, a flat LaB$_6$ emitter disk 53*a* (outside diameter 17 mm) is inserted, on the assembly base 50. The emitter 53*a* and the graphite ring 53*b* together form a hybrid cathode 53, in which electrons for an electron beam 55 are emitted primarily by the emitter 53*a*. In this case, the assembly base 50 is designed such that an evacuated interstice 54 with a height of 10 mm is generated on a large scale between the hybrid cathode 53 and the insulator body 58. A thermally floating multilayer radiation shield 56 is installed in said interstice 54. The multilayer radiation shield 56 is formed by three riveted together, parallel stainless steel plate disks separated by spacers. Because of the improved thermal insulation of the hybrid cathode 53 (as compared to the thermal insulation ability of an individual interstice, as realized by a gap 44 from FIG. 4), a cooling medium no longer needs to flow directly around the assembly base 50. The hollow spaces 57 for guiding a cooling medium are in fact integrated into the electrical insulator body 58, thereby achieving the sought-after separation of the cooling medium and cathode potential. A vacuum-tight, high-voltage lead 51 likewise runs through the insulator body 58, which conducts the high voltage required for the operation of the associated electron emitter to the multilayer radiation shield 56 and via said shield to the cathode 53.

The invention claimed is:

1. A device for producing an electron beam, comprising:
   a housing, which delimits a space that is evacuatable, and comprises an electron beam outlet opening;
   an inlet structured and arranged for feeding a process gas into the space; and
   a planar cathode and an anode, which are arranged in the space, and between which, a glow discharge plasma is producible by an applied electrical voltage, wherein ions are accelerateable from the glow discharge plasma onto a surface of the cathode and electrons emitted by the cathode are accelerateable into the glow discharge plasma, wherein:
   a) the cathode comprises a first part made of a first material at least on an emission side, which forms a centrally arranged first surface region of the cathode;
   b) the cathode comprises a second part made of a second material, which forms a second surface region of the cathode that encloses the first surface region;
   c) the first material is electrically conductive and has a melting point $T_s > 1750$ K; and
   d) the first material is heatable by impingement with accelerated ions to a temperature at which electrons escape from the first material predominantly due to thermionic emission.

2. The device according to claim 1, wherein the first surface region is flat.

3. The device according to claim 1, wherein the first surface region is concave.

4. The device according to claim 1, wherein the second surface region is concave.

5. The device according to claim 1, wherein the first material comprises a rare earth boride.

6. The device according to claim 1, wherein the first surface region comprises a solid molded body made of the first material.

7. The device according to claim 1, wherein the first surface region is a constituent of a composite body.

8. The device according to claim 1, wherein the second material comprises graphite.

9. The device according to claim 1, wherein the second material comprises a metal.

10. The device according to claim 1, wherein the first surface region and the second surface region are separated from one another by a circumferential gap around the first surface region.

11. The device according to claim 1, further comprising a rear-side thermal barrier of cooled parts, wherein at least the first material is thermally insulated by the rear-side thermal barrier of cooled parts.

12. The device according to claim 11, wherein the thermal barrier comprises at least one of:
   at least one gap that is evacuateable; and
   a thermal insulator.

13. The device according to claim 1, wherein the process gas of the glow discharge plasma is one of an inert gas and hydrogen.

14. The device according to claim 1, wherein a beam power of the device is controllable in the case of constant or pulsed operating voltage by varying a process gas flow of the glow discharge plasma.

15. The device according to claim 1, further comprising an electrical insulator body, wherein the electrical insulator body comprises cooling channels separated from a cathode potential and a vacuum-tight high-voltage lead-through.

16. The device according to claim 1, further comprising a magnetic coil system in a region between the cathode and the anode, wherein a propagation direction of the electron beam in the cathode chamber is controllable by a transverse magnetic field produced by the magnetic coil system.

17. The device according to claim 15, wherein the electrical insulator body comprises a synthetic material comprising one of an oxide ceramic and aluminum nitride.

18. The device according to claim 1, wherein the planar cathode comprises at least one planar surface.

19. The device according to claim 5, wherein the first material comprises lanthanum hexaboride (LaB$_6$).

* * * * *